United States Patent [19]
McGlinchey

[11] Patent Number: 5,677,558
[45] Date of Patent: Oct. 14, 1997

[54] LOW DROPOUT LINEAR REGULATOR

[75] Inventor: Gerard F. McGlinchey, Enniskerry, Ireland

[73] Assignee: Analog Devices, Inc., Norwood, Mass.

[21] Appl. No.: 688,557

[22] Filed: Jul. 30, 1996

Related U.S. Application Data

[63] Continuation of Ser. No. 397,901, Mar. 3, 1995, abandoned.
[51] Int. Cl.$^6$ .......... H01L 29/76; H01L 29/94; H01L 31/062; H01L 31/119
[52] U.S. Cl. .......... 257/370; 257/373; 327/564
[58] Field of Search .......... 257/370, 373, 257/547; 327/564

[56] References Cited

U.S. PATENT DOCUMENTS

| | | | |
|---|---|---|---|
| 4,812,891 | 3/1989 | Bingham | 357/35 |
| 4,893,157 | 1/1990 | Miyazawa et al. | 257/742 |
| 5,245,202 | 9/1993 | Yasazaka | 257/133 |

OTHER PUBLICATIONS

Sedra et al, *Micro Electronic Circuits*, p. 795, ©1982.
Muller et al, *Device Electronics for IC's*, p. 122, ©1986.
Sedra, *Microelectronic Circuits* p. 798, 1986.

*Primary Examiner*—Stephen Meier
*Attorney, Agent, or Firm*—Koppel & Jacobs

[57] ABSTRACT

A low dropout linear regulator utilizing a vertical PNP transistor as its pass element, integrated with CMOS circuitry. The vertical PNP transistor includes a P-well formed in a lightly doped N type substrate for its collector. An N-type region formed in the P-well is its base and a P-type region formed in the N-type region is its emitter. The emitter receives a variable input supply and the collector provides a regulated output signal to the load being driven. As the input voltage diminishes to less than a diode drop above the output voltage, the vertical PNP transistor tries to saturate and its associated parasitic NPN transistor turns on. To limit the effects of the parasitic NPN transistor and maintain a regulated output, a current limiter is connected between the input and the collector of the NPN parasitic transistor. As the input voltage drops, the possibility of lateral current flow from the P-well of the vertical PNP transistor through the substrate to NMOS devices comprising the CMOS circuitry increases. A current diverter is connected to the body of each NMOS device to prevent the lateral currents from entering the sources and drains of the NMOS devices.

14 Claims, 2 Drawing Sheets

LOW DROPOUT LINEAR REGULATOR

This application is a continuation of application Ser. No. 08/397,901, filed Mar. 3, 1995, now abandoned.

BACKGROUND OF THE INVENTION

1. Field of the Invention

The present invention relates to circuitry for regulating a variable input signal to provide a constant output signal, and more specifically to a series low dropout linear voltage regulating circuit (regulator) using a PNP transistor pass element with the capacity for integration into circuits using CMOS process technology.

2. Description of the Related Art

Many circuits, such as integrated circuits (ICs), require a power supply with a constant voltage level and a varying current to accommodate for varying load conditions. The problem is that typical power supplies, such as batteries, experience variations in their output voltage level as load conditions change and as the battery dies down. A variable power source therefore cannot be directly applied to an IC. The function of a regulator is to produce a regulated output from a variable power supply. The output of the regulator is then used as a power source for other circuits.

One type of IC regulator is the linear voltage regulator, which includes error amplifiers, voltage reference generators and logic to control the voltage across a pass element that is connected in series with the load. Typically, the pass element is a power transistor. By operating the transistor in its linear region, it conducts current continuously and provides an uninterrupted output signal. Important features of a linear regulator include a low dropout voltage and a high maximum load capacity. The dropout voltage is the lowest input voltage at which a regulated output voltage is maintained. The output voltage level is determined by the requirements of the external circuitry being supplied. Below the dropout voltage, the regulator fails to provide a regulated output voltage.

In implementing a linear regulator, both MOS and bipolar transistors may be used as the pass element, since they are both effective low on resistance switches for sourcing high currents. Bipolar transistors are preferable to MOS transistors because they occupy less space on the IC, and thus allow for more efficient use of chip area and lower manufacturing costs. A disadvantage of bipolar transistors, however, is that many ICs are implemented using CMOS rather than bipolar circuitry. One problem with using bipolar technology on CMOS ICs is that PN junctions inherent in the IC may become forward biased, resulting in a loss of junction isolation and resulting degradation of the circuit characteristics. A requirement for integrating a bipolar pass element with CMOS circuitry, therefore, is to eliminate the effect of currents between the bipolar and MOS devices on the IC. Another problem when introducing bipolar technology into the CMOS process is that additional fabrication steps may be needed.

One linear regulator which integrates a lateral bipolar transistor as the pass element into CMOS circuitry is disclosed in U.S. Pat. No. 4,812,891, Bingham, Mar. 14, 1989. It uses a dual serial collector lateral PNP pass-transistor. When the transistor's collector-base voltage approaches the emitter-base voltage the transistor saturates, which initiates the flow of minority carriers from the base to the dual collectors. The substrate acts as a barrier to the vertical flow of minority carriers (perpendicular to the surface of the substrate facing the emitter). The first collector collects the laterally flowing minority carriers (parallel to the surface of the epitaxial layer in which the emitter is formed). Any lateral current not collected by the first collector is collected by the second collector, preventing the flow of base-to-collector current to the circuitry external to the lateral PNP pass-transistor region.

To preserve junction isolation, a diode-connected N-channel transistor is positioned next to the lateral PNP transistor to prevent it from forward biasing with respect to the all P regions in the substrate. The N-channel transistor is connected by its gate and drain to the highest voltage supply VIN+, and its source is connected to its body. The body is thus prevented from forward biasing with respect to the substrate.

This circuit has a small geometry compared to MOS devices and is capable of supporting MOS circuitry. However, the lateral pass-transistor has only a limited current capacity, current gain and maximum load capacity. Another problem is that in fabricating the pass-transistor, an extra step is added to the CMOS process.

SUMMARY OF THE INVENTION

The present invention is a low dropout linear regulator utilizing a vertical PNP transistor as the pass element. The PNP transistor may be integrated into CMOS circuitry without requiring complicated fabrication steps, and has a low dropout voltage and a high maximum load current capacity.

The PNP transistor includes a P well formed in a lightly doped N type substrate for its collector. Within the P well is an N type base region of a higher concentration than the substrate. Inside the base is a P type region which serves as the emitter. The emitter of the PNP transistor is connected to the input supply terminal and its collector is connected to the output terminal. The supporting circuitry of the regulator includes a reference voltage generator, a voltage divider and an error amplifier. By equating the midpoint voltage of the voltage divider to a reference voltage, the error amplifier monitors the PNP transistor collector current and voltage, drawing base current from the PNP transistor to maintain the collector current at the level required by the load. The base current drawn in turn forward biases the emitter-base junction of the PNP transistor and maintains the base voltage at a diode drop below the input voltage.

When the input supply voltage is more than a diode drop above the output, the PNP transistor functions in its normal mode. In this mode the output voltage is kept constant and a low base current is drawn by the error amplifier to supply the collector current. As the input voltage drops to less than a diode drop, approximately 0.7V, above the collector voltage, the base voltage drops below the collector voltage and the PNP transistor begins to saturate. In the saturation mode, the PNP transistor continues to function as a linear pass element, but its current gain ($\beta$) drops and its required base drive increases.

As the input voltage drops to approximately 0.17V above the predetermined output voltage, the error amplifier can no longer draw the required base current to supply the load current. The regulator thus drops out and the output voltage is no longer maintained at the constant predetermined level. As the input continues to drop, the output voltage tracks the input at 0.17V below it. This input to output relationship is continued until the input reaches 2.0V, at which point the regulator stops conducting between the input terminal and the output terminal.

The regulator's PNP transistor has a parasitic NPN transistor effect associated with it which turns on as the PNP transistor base voltage drops below its collector voltage. The resulting parasitic NPN transistor currents retard the saturation of the PNP transistor. A current limiter is connected between the input terminal and the collector of the parasitic NPN transistor to limit parasitic currents through it as the transistor saturates. A side effect of the current limiter is that the voltage drop across it causes the substrate voltage to drop below the input voltage. This increases the possibility of the pass transistor's P well forward biasing with respect to the substrate and forming a parasitic lateral PNP transistor with other P wells formed on the substrate. A current diverter is used to prevent parasitic currents between P wells in the substrate from entering the sources and drains of CMOS circuitry integrated onto the substrate.

DETAILED DESCRIPTION OF THE INVENTION

Figure 1:
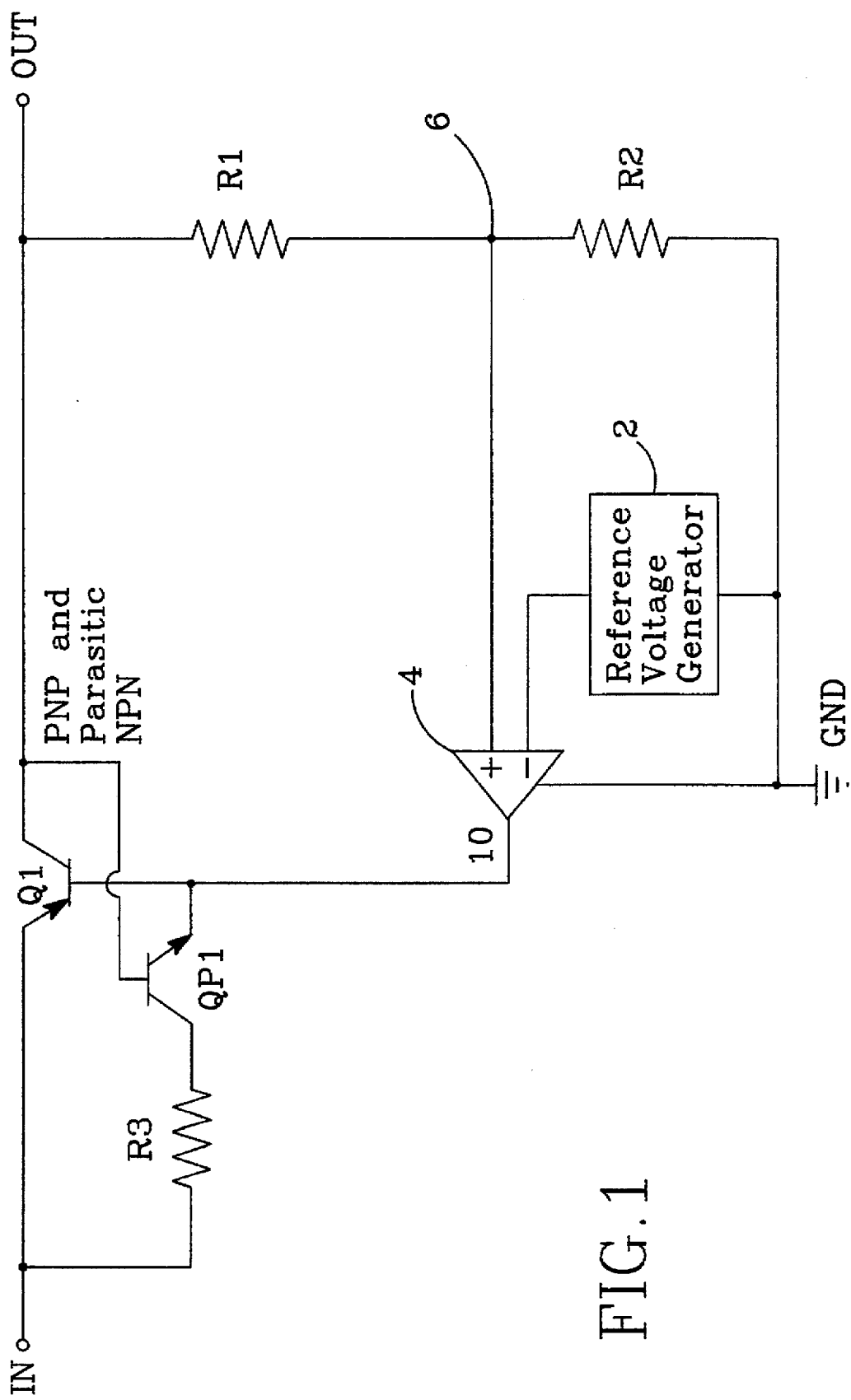
FIG. 1 is a schematic diagram illustrating the regulator of the present invention with a vertical PNP transistor as the pass element.

FIG. 1 shows an embodiment of the present regulator, which uses a vertical PNP transistor Q1 as a pass element. The regulator includes supporting circuitry which controls the voltage across Q1 and pushes it into or out of saturation mode, depending upon the input voltage level at the input terminal IN. Q1, by fluctuating into or out of saturation, can receive a varying input signal and supply a regulated output voltage and current to the output terminal OUT. The output terminal is connected to the load being driven.

The supporting circuitry includes a reference voltage generator 2 which generates a predetermined reference voltage. The reference voltage generator 2 is preferably a Zener diode or a band-gap voltage reference circuit that includes PMOS and NMOS devices and PNP transistors, fabricated using conventional CMOS process technology. In a preferred embodiment, the reference voltage is approximately 1.255V. The supporting circuitry also includes an error amplifier 4 in the form of an operational amplifier which includes PMOS and NMOS devices fabricated using conventional CMOS process technology. The error amplifier 4 has its inverting input connected to the reference voltage generator output and its non-inverting input connected to the midpoint 6 of a voltage divider circuit consisting of resistors R1 and R2 connected in series between OUT and ground GND. The error amplifier 4 holds the midpoint voltage equal to the reference voltage. This in turn maintains a constant output voltage at OUT, as determined by the relative resistance values of R1 and R2. The predetermined voltage is set according to the requirements of the external circuitry being supplied; 5.0V is a common output for applications such as laptop computers.

Another requirement of the external circuitry is that the load current supplied at OUT by Q1's collector must be adjustable to accommodate for variable load conditions such as a disk drive in a computer turning on or off. To supply a variable load current at OUT, the error amplifier output 10 is connected to receive Q1's base current. When the load current varies the current through R1 and R2 also varies, changing the voltage across R1 and R2. The error amplifier 4 corrects this by varying the base current it draws from Q1. This change in Q1's base current in turn changes Q1's collector current and adjusts the voltage across R1 and R2. The base current drawn from Q1 is adjusted until its collector current equals the required load current. As an example, when a disk drive connected to OUT turns on, the load current required at OUT increases. The current through R1 and R2 subsequently drops, resulting in an increased base current drawn from Q1 by the error amplifier 4. The increase in the base current drawn from Q1 is continued until Q1's collector current equals the required load current.

The Q1 base drive drawn by the error amplifier 4 also forward biases Q1's emitter-base junction. This is due to the exponential relationship between the base current of a bipolar transistor and its emitter-base voltage. By drawing a current from Q1's base, the error amplifier 4 controls the current through Q1 and forward biases its emitter-base junction. The resulting voltage at the error amplifier output 10 is the input voltage at IN minus the Q1 emitter-base junction diode drop of approximately 0.7V.

Depending upon the input voltage, Q1 operates in either its normal mode or its saturation mode. When the input voltage is approximately a diode drop or more above the output voltage, Q1 operates in the normal mode. This is because its base-to-emitter junction is forward biased and its base voltage, which is a diode drop below the input voltage, is greater than its collector voltage. In the normal mode, the $\beta$ of Q1 is approximately 100 and a low base drive is required to provide the necessary load current at OUT. The error amplifier 4 typically draws a 2 mA base current from Q1 when a maximum load current of 200 mA is required.

As the input power supply depletes and the input voltage falls to less than a diode drop above the output voltage, Q1's base voltage drops below the output voltage. The emitter-to-base junction of Q1 remains forward biased, however, and its collector voltage rises above its base voltage, forward biasing its collector-to-base junction. This pushes Q1 into its saturation mode and causes its $\beta$ value to drop. A greater Q1 base drive is then required by the error amplifier 4 to maintain a constant load current at OUT. The required base drive continually increases as the input voltage decreases because the emitter-to-collector voltage differential of Q1 approaches zero and Q1's $\beta$ decreases. The limit to the decrease in $\beta$ and the increase in Q1's required base drive before the regulator drops out is the maximum output current of the error amplifier 4, which is approximately 40–50 mA for an exemplary implementation. To provide a maximum load current of 200 mA with a maximum base drive of 40–50 mA, the $\beta$ of Q1 cannot drop below 4–5. Q1's $\beta$ reaches 4–5 when its emitter voltage is approximately 0.17V above its collector voltage. Therefore, the regulator maintains a constant output voltage and can provide a maximum load current of 200 mA as long as the input voltage is equal to or greater than approximately 0.17V above the predetermined output voltage level.

When the input voltage drops to less than approximately 0.17V above the desired output voltage, the output voltage linearly decreases with the input and remains 0.17V below the input. For example, if the desired output is 5.0V, once the input voltage drops below 5.17V, the output begins to linearly decrease with the input. Thus, if the input drops to 5.07V, the output will fall to 4.9V. Many circuits can still operate as long as the output provided by the regulator does not vary significantly below the predetermined level. Thus, for some IC's normally requiring 5.0V, 4.9V is acceptable.

One design constraint associated with the regulator as described is the development of parasitic effects. As Q1 tries to saturate, an associated parasitic vertical NPN transistor QP1 with a base at the collector of Q1, an emitter at the base of Q1 and a collector at the emitter of Q1 also turns on and draws current. This is due to QP1's base voltage, which is at the same voltage as Q1's collector, increasing above QP1's emitter voltage and forward biasing QP1's base-to-emitter junction. QP1's emitter then supplies current to the error amplifier 4, reducing the current it draws from Q1's base. This in turn reduces Q1's collector current, causing the current supplied to the load at OUT to drop. To control the effect of QP1, a current limiter 14 is connected between IN and QP1's collector. The current limiter 14 limits the maximum saturation current through QP1 to an insignificant level compared to the current drawn from Q1's base. This prevents the output current supplied to the load from being significantly reduced by the QP1 current.

One implementation of the current limiter 14 is a resistor R3 as shown in FIG. 1. The voltage across the resistor R3 is the input voltage less QP1's collector voltage. Since QP1's emitter is approximately 0.7V below the input (through the emitter-base junction of Q1) and QP1's collector-to-emitter voltage during saturation is approximately 0.1V, the voltage across the resistor is approximately 0.6V. Considering that the error amplifier draws a maximum of 40–50 mA from Q1's base when Q1 is in saturation, a preferred resistor value of 200 ohms limits the current through QP1 to approximately 3 mA (0.6V/200 ohms). 3 mA is a significantly small current compared to the maximum base current 40–50 mA that is supplied by the error amplifier 4. The resistor R3 can be either a discrete resistor, a diffused resistor, a JFET resistor, a thin-film resistor or a resistor that may be implemented into a CMOS process.

Figure 2:
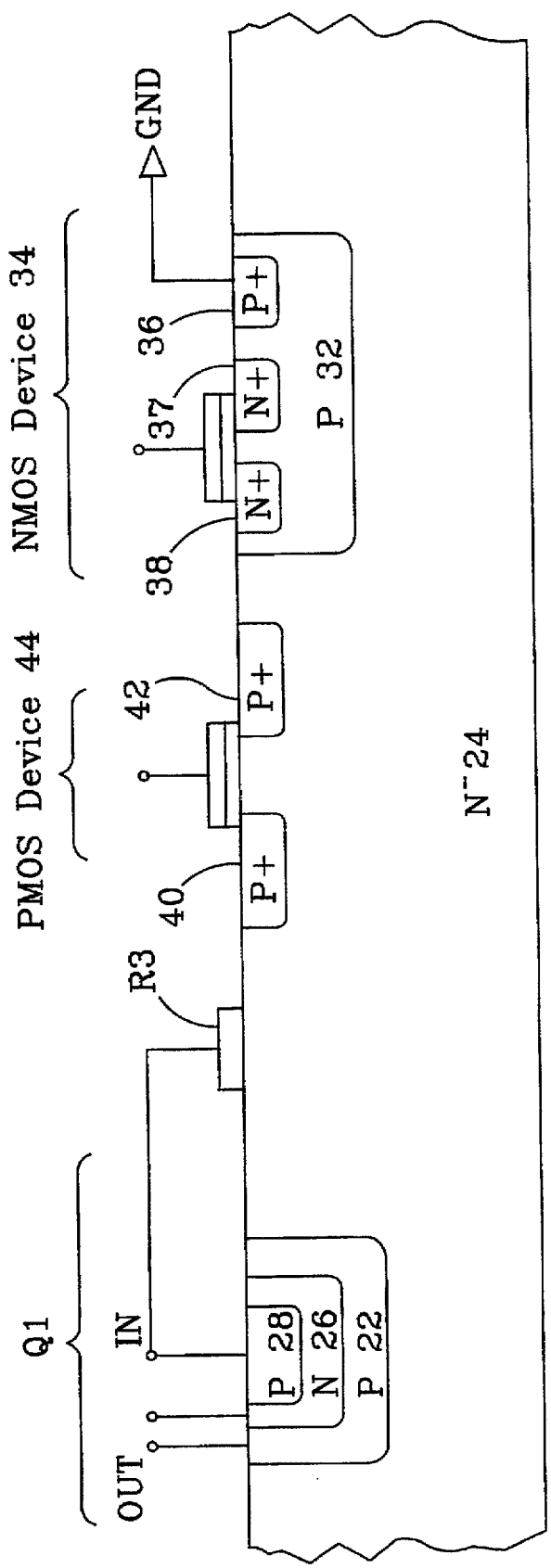
FIG. 2 is a cross-sectional diagram of the structure of the vertical PNP transistor pass element integrated with CMOS circuitry.

FIG. 2 is a cross-sectional diagram of the vertical PNP transistor of this invention integrated with CMOS circuitry utilizing CMOS process technology. The vertical PNP structure Q1 includes a P well 22 formed in an N type substrate 24 using a conventional CMOS process. P well 22 is the collector, within which is formed an N type base region 26. Inside the base is a P type region 28 which serves as the emitter. The emitter is connected to IN for receiving the input voltage to be regulated, and its collector is connected to OUT to provide the regulated output signal.

The vertical parasitic NPN transistor QP1 of FIG. 1 appears in FIG. 2 with the N type region 26 as the emitter, the P well 22 as its base, and the N type substrate 24 as its collector. As in the circuit of FIG. 1, a current limiter, interposed between IN and the substrate 24, limits the current to the emitter of the saturated parasitic NPN transistor QP1. In FIG. 2, the current limiter is a thin-film resistor R3. R3 is fabricated by sputtering and patterning a thin layer of silicon-chrome material onto the substrate 24. The advantage of a thin-film resistor is that it is fully isolated from the other semiconductor regions on the substrate. R3 may also be implemented as a discrete resistor, a JFET resistor, a diffused resistor or a resistor that may be implemented into a CMOS process.

A side effect of the use of a resistive current limiter is that the voltage drop across R3 causes the substrate voltage to fall below the input voltage by approximately 0.6V during the saturation of the parasitic NPN transistor, as described above. This causes the substrate voltage to drop below the output voltage when the input voltage drops to less than 0.6V above the output voltage. This in turn means that the N type substrate 24 is at a lower voltage than the collector P well 22. As the input voltage continues to drop, the PN junction from the P well 22 to the substrate 24 forward biases. Junction isolation is thus lost, initiating the formation of a lateral parasitic PNP transistor with the P well 22 acting as an emitter and other P wells such as the P well 32 of the NMOS device 34 which is integrated into the same substrate, acting as a collector. The substrate 24 in between acts as the base. The effect of parasitic currents is to degrade the frequency response and current efficiency of the circuit.

To eliminate the effect of the lateral parasitic PNP currents, a plurality of current diverters are used to channel parasitic currents away from the sources and drains of MOS circuitry formed in the substrate 24. A current diverter is implemented by connecting the body of P-wells formed in the substrate 24, other than the body of P well 22 and the body of other vertical PNP transistors, to ground. This implementation includes connecting the body of the NMOS devises included in the reference voltage generator 2 and the error amplifier 4 circuits of FIG. 1 formed in the substrate 24 to ground. As an example of the current diverter in FIG. 2, the body 36 of the NMOS device 34 is connected to ground GND. This safely diverts lateral parasitic PNP currents flowing from P well 22 to the P well 32 of the NMOS device 34 to ground, and the source 37 and drain 38 of the NMOS device 34 are not affected. PMOS devices are not affected by the loss of junction isolation because their sources and drains are at the same voltage as the substrate 24. For example, the source 40 and drain 42 of the PMOS device 44 are at the same voltage as substrate 24 and will not forward bias with respect to the substrate. Thus, although the loss of junction isolation for NMOS devices is not prevented, the MOS circuitry with which the regulator is integrated into the substrate 24 is not contaminated by parasitic currents from Q1.

While particular embodiments of the invention have been shown and described, numerous variations and alternative embodiments will occur to those skilled in the art. Accordingly, the invention is intended to be limited only in terms of the appended claims.

I claim:

1. A low dropout linear regulator integrated with CMOS circuitry, comprising:

an input terminal for receiving a variable input signal, an output terminal for providing a regulated output signal, a vertical PNP pass transistor having an emitter connected to said input terminal, a collector formed as a P-well in an N-type substrate and being connected to said output terminal, and a base, and a current limiter connected between said input terminal and said n-type substrate to limit current between said input terminal and said substrate and to thereby permit said pass transistor to enter saturation and provide low dropout regulation.

2. A low dropout linear regulator as in claim 1, wherein said current limiter comprises a resistor.

3. A low dropout linear regulator for receiving a variable input signal at an input terminal and producing a regulated output signal at an output terminal, integrated with CMOS circuitry, comprising:

a reference voltage generator for generating a reference voltage, a voltage divider connected to said output terminal, a vertical PNP pass transistor having an emitter connected to receive said variable input signal, a base, and a collector formed as a P-well in an N-type substrate and connected to provide said regulated output signal, a CMOS error amplifier connected to compare the voltage at said voltage divider tap to said reference voltage and to sink a variable current from said base, the magnitude of said variable current being determined by said amplifier as a function of said comparison, and a current limiter connected between said input terminal and said N-type substrate to limit current between said input terminal and said substrate and to thereby permit said pass transistor to enter saturation and provide low dropout regulation.

4. A regulator as in claim 3, wherein said current limiter comprises a resistor.

5. A regulator as in claim 3, wherein said CMOS circuitry is comprised of PMOS and NMOS devices, said NMOS devices having source, drain, and body regions, and said regulator further comprising, a plurality of current diverters connected to respective ones of said NMOS devices to prevent current from the collector of said vertical PNP transistor from entering the source and drain regions of said NMOS devices.

6. A regulator as in claim 5, wherein said current diverters comprise connections between the body region of each of said NMOS devices and ground.

7. A low dropout regulator, comprising:

an N-doped semiconductor substrate, a vertical PNP pass transistor, including a P-well formed in said substrate and forming the collector of said pass transistor, said collector for providing power at regulated output voltage, an N-type region formed in said P-well, with a doping concentration substantially greater than said substrate, said N-type region forming the base of said pass transistor, and a P-type region formed in said N-type region and forming the emitter of said pass transistor, said emitter for receiving power at an unregulated voltage, a CMOS error amplifier sharing said substrate and connected to sink a variable current from the base of said pass transistor, and a current limiter connected between said emitter and said substrate to limit the current flowing from said substrate to said base when said P-well forward biases with respect to said base.

8. A regulator as in claim 7, further including:

additional P type regions in said substrate comprising the sources and drains of respective PMOS devices, additional P-wells in said substrate, additional N-type regions in said additional P-wells, said additional N-type regions comprising the sources and drains of respective NMOS devices, and a plurality of current diverters, coupled to said additional P-wells to prevent the flow of current from said P-well to said sources and drains of said NMOS devices.

9. A regulator as in claim 8, wherein said current diverters comprise connections between said additional P-wells and ground.

10. A regulator as in claim 7, wherein said current limiter comprises a thin-film resistor formed in said substrate.

11. A low dropout linear regulator integrated with CMOS circuitry, comprising:

an N-doped semiconductor substrate, a vertical PNP transistor, including a P-well formed in said substrate, an N-type region formed in said P-well, with a doping concentration substantially greater than said substrate, a P-type region formed in said N-type region, an input terminal connected to provide a variable signal to said P-type region, an output terminal connected to receive a regulated output signal from said P-well, a reference voltage generator for generating a reference voltage, a voltage divider connected to said P-well, a CMOS error amplifier supplied by said voltage reference generator and connected to said voltage divider to establish an output voltage at said P-well, said error amplifier connected to receive a variable current from said N-type region, and a current limiter connected between said P-type region and said substrate to limit the current flowing between said substrate and said N type region when said P-well forward biases with respect to said N type region.

12. A regulator as in claim 11, wherein said current limiter comprises a thin-film resistor formed in said substrate.

13. A regulator as in claim 11, wherein said CMOS circuitry is comprised of PMOS and NMOS devices formed in said substrate, said NMOS devices having source, drain, and body regions, and further comprising, a plurality of current diverters connected to respective ones of said NMOS devices to prevent current from said P-well from entering the source and drain regions of said NMOS devices.

14. A regulator as in claim 13, wherein said current diverters comprise connections between the body region of each of said NMOS devices and ground.

* * * * *